United States Patent [19]

Humphreys et al.

[11] Patent Number: 5,212,401

[45] Date of Patent: May 18, 1993

[54] HIGH TEMPERATURE RECTIFYING CONTACT

[75] Inventors: Trevor P. Humphreys, Raleigh; Robert J. Nemanich, Cary; Kalyankumar Das, Raleigh, all of N.C.

[73] Assignees: Kobe Steel USA, Inc., New York, N.Y.; North Carolina State University, Raleigh, N.C.

[21] Appl. No.: 735,602

[22] Filed: Jul. 25, 1991

[51] Int. Cl.$^5$ ............................................. H01L 29/48
[52] U.S. Cl. .................................. 257/473; 257/472; 257/77; 257/627; 437/176
[58] Field of Search .................. 357/15, 60, 52 R, 52, 357/16; 437/176, 179, 175, 187

[56] References Cited

U.S. PATENT DOCUMENTS

| | | | |
|---|---|---|---|
| 4,062,660 | 12/1977 | Nicholas et al. | 51/295 |
| 4,982,243 | 1/1991 | Nakahata et al. | 357/15 |
| 5,008,732 | 4/1991 | Kondo et al. | 357/67 |
| 5,055,424 | 10/1991 | Zeidler et al. | 437/194 |

FOREIGN PATENT DOCUMENTS

| | | |
|---|---|---|
| 64-612 | 1/1989 | Japan . |
| 2-212065 | 8/1990 | Japan . |

OTHER PUBLICATIONS

Lurie & Wilson, "The Diamond Surface", *Surface Science*, 65(1977), pp. 453–511.
Pickett & Erwin, "Electronic structure of an ideal diamond nickel (001) interface", Physical Review B, vol. 41, pp. 9756–9764 (1990).
Pavlidis, "The Growth of Epitaxial Thin Nickel Films on Diamond", Thin Solid Films, 42(1977), pp. 221–226.

*Primary Examiner*—Rolf Hille
*Assistant Examiner*—Minhloan Tran
*Attorney, Agent, or Firm*—Bell, Seltzer, Park & Gibson

[57] ABSTRACT

A rectifying contact for use at high temperatures including a monocrystalline semiconducting diamond layer on a substrate and a heteroepitaxial metal layer thereon. The metal layer has a lattice match with the diamond and is deposited on the diamond substantially in atomic registry therewith. The metal and diamond form a rectifying contact which has good mechanical adhesion and provides stable rectifying operation at elevated temperatures. The metal layer may be formed by deposition in an ultra-high vacuum. In alternate embodiments, the metal layer may be formed on a monocrystalline semiconducting diamond substrate or on at least one monocrystalline diamond area of a textured polycrystalline layer.

12 Claims, 3 Drawing Sheets

HIGH TEMPERATURE RECTIFYING CONTACT

FIELD OF THE INVENTION

This invention relates to semiconductor devices, and more particularly to a high temperature rectifying contact for semiconductor devices.

BACKGROUND OF THE INVENTION

Diamond is a preferred material for semiconductor devices because it has semiconductor properties that are better than traditionally used silicon (Si), germanium (Ge) or gallium arsenide (GaAs). Diamond provides a higher energy band gap, a higher breakdown voltage and a greater saturation velocity than these traditional semiconductor materials. These properties of diamond yield a substantial increase in projected cutoff frequency and maximum operating voltage compared to devices fabricated using Si, Ge, or GaAs. Si is typically not used at temperatures higher than about 200° C. and GaAs is not typically used above 300° C. These temperature limitations are caused, in part, because of the relatively small energy band gaps for Si (1.12 eV at ambient temperature) and GaAs (1.42 eV at ambient temperature). Diamond, in contrast, has a large band gap of 5.47 eV at ambient temperature, and is thermally stable up to about 1400° C.

Diamond has the highest thermal conductivity of any solid at room temperature and exhibits good thermal conductivity over a wide temperature range. The high thermal conductivity of diamond may be advantageously used to remove waste heat from an integrated circuit, particularly as integration densities increase. In addition, diamond has a smaller neutron cross-section which reduces its degradation in radioactive environments, i.e., diamond is a "radiation-hard" material.

Because of the advantages of diamond as a material for semiconductor devices, there is at present an interest in the growth and use of diamond for high temperature and radiation-hardened electronic devices. Consequently, the fabrication of metal contacts to diamond will play an important role in the development of future diamond-based devices.

It has been demonstrated previously that gold (Au) or tungsten (W) contacts on a diamond layer provide rectification at temperatures of up to 400° C. Unfortunately, the adhesion of these layers to the diamond, particularly at high temperatures, is often poor. Other rectifying contacts are also known. For example, U.S. Pat. No. 4,982,243 to Nakahata et al. discloses a Schottky rectifying contact which includes a monocrystalline diamond substrate, an epitaxial monocrystalline diamond layer on the substrate, and a metal electrode layer formed on the diamond layer. The diamond layer is epitaxially grown on the surface of the monocrystalline diamond substrate, which surface inclines at an angle of not larger than 10° to the (100) plane. The surface of the substrate is polished to produce the required uniformity of the diamond substrate.

The prior art has been limited to rectifying operation of contacts at relatively low temperatures, and also limited by poor adhesion of the metal contact layer to the diamond at elevated temperatures.

SUMMARY OF THE INVENTION

It is therefore an object of the present invention to provide a stable rectifying contact with improved mechanical adhesion on diamond and which operates at elevated temperatures (e.g., temperatures of about 400° C. and beyond) and a method for making the same.

This and other objects according to the present invention are provided by a rectifying contact which includes, in a preferred embodiment, a monocrystalline semiconducting diamond layer or substrate and a heteroepitaxial metal layer deposited thereon. The metal of the heteroepitaxial metal layer has a lattice match with the monocrystalline semiconducting diamond layer. By lattice matching, the layers are in atomic registry with each other, namely the crystal structures are substantially in alignment with each other. Lattice match relates to the difference between the lattice constant ("$a_o$") of diamond and the metal, and is typically expressed in terms of a "lattice mismatch". Preferably the lattice mis-match is less than about 7 percent, preferably less than about 4 percent, and more preferably less than about 2 percent relative to the lattice constant of diamond. The lattice matching results in strong atomic bonding and an atomically abrupt interface. This permits stable rectifying operation of the contact at elevated temperatures of about 400° C. and beyond, and provides excellent adhesion of the metal layer at these elevated operating temperatures.

Preferably, the metal of the heteroepitaxial metal layer has no stable metal carbides so that carbide formation is avoided at higher temperatures. Preferably the metal is nickel, copper, nickel/copper alloy or an alloy of nickel and a metal having no stable metal carbides and being capable of forming a homogeneous alloy with nickel (e.g., gold, palladium, platinum, etc.). These metals and alloys are selected because of their relatively close lattice match with diamond.

Another embodiment of the rectifying contact according to the present invention includes a textured polycrystalline diamond layer or substrate having a plurality of monocrystalline semiconducting diamond areas on the surface thereof. The heteroepitaxial metal layer is deposited on the textured polycrystalline diamond layer substantially in atomic registry with at least one of the monocrystalline diamond areas thereby producing strong atomic bonding and an atomically abrupt interface therewith.

The rectifying contact may be fabricated by forming a heteroepitaxial metal layer on a monocrystalline semiconducting diamond layer or substrate, preferably in an ultra-high vacuum (i.e., less than about $10^{-9}$ Torr) using a conventional thermal, or electron-beam evaporation technique. The monocrystalline diamond layer or substrate is preferably maintained at a temperature of about 500° C. during the growth of the metal layer.

The rectifying junction according to the present invention provides stable electrical operating characteristics over a wider temperature range than conventional Si or GaAs based semiconductor devices. Because of the strong atomic bonding at the interface between the diamond and the heteroepitaxial metal layer, good mechanical adhesion of the metal is also maintained even at elevated temperatures.

The semiconductor devices of the present invention can be used to replace existing non-diamond rectifying contacts as will be known to those skilled in the art, and is particularly used for rectifying contacts which are exposed to elevated temperatures of about 400° C. and beyond.

DETAILED DESCRIPTION OF THE PREFERRED EMBODIMENTS

Figure 1:
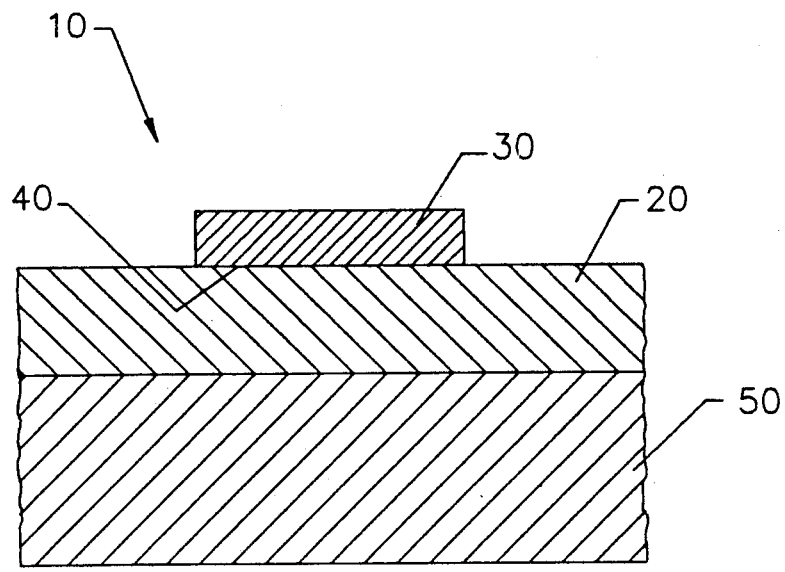
FIG. 1 is a cross-sectional side elevation view of a rectifying contact according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, Applicants provide these embodiments so that this disclosure will be thorough and complete, and will fully convey the scope of the invention to those skilled in the art. In the drawings, the thickness of layers and regions are exaggerated for clarity. Prime notation is used to indicate similar elements.

Referring to FIG. 1, there is shown a rectifying contact according to the present invention designated by reference numeral 10. The contact 10 includes a monocrystalline semiconducting diamond layer 20 onto which is deposited a heteroepitaxial metal layer 30. In the embodiment illustrated in FIG. 1, the semiconducting monocrystalline diamond layer 20 is formed on a substrate 50. Exemplary substrates 50 may be silicon, diamond, sapphire, boron nitride, and the like.

The monocrystalline diamond layer 20 may have a thickness of greater than about 100 Å, preferably between about 1 Å and about 250 μm, and most preferably about 1 μm to about 250 μm. The heteroepitaxial metal layer 30 may have a thickness of greater than about 20 Å and between about 500 Å and 1 μm.

Exemplary sources of the monocrystalline diamond layer 20 are natural diamond and synthetic diamond formed under high pressure and high temperature. Additionally the monocrystalline diamond layer 20 may be polished to obtain the preferred crystal orientation (e.g., (001), (011) and (111)).

The heteroepitaxial metal layer 30 is deposited onto the monocrystalline diamond layer 20 using any of the known thermal deposition, electron-beam evaporation, chemical vapor deposition, molecular beam deposition or any other techniques for depositing the metal as a heteroepitaxial layer. The deposition is preferably conducted in a ultra-high vacuum (i.e., less than about $10^{-9}$ Torr). This vacuum provides an environment substantially free of contaminants to provide a diamond layer 20 which is atomically and chemically clean with little or no impurities thereon. This also facilitates two-dimensional crystalline growth as compared to undesirable three-dimensional crystal growth. Additionally, the monocrystalline semiconducting diamond layer 20 may be heated for a predetermined time to a temperature greater than about 500° C. to desorb water vapor and gas contaminants therefrom.

Figure 2:
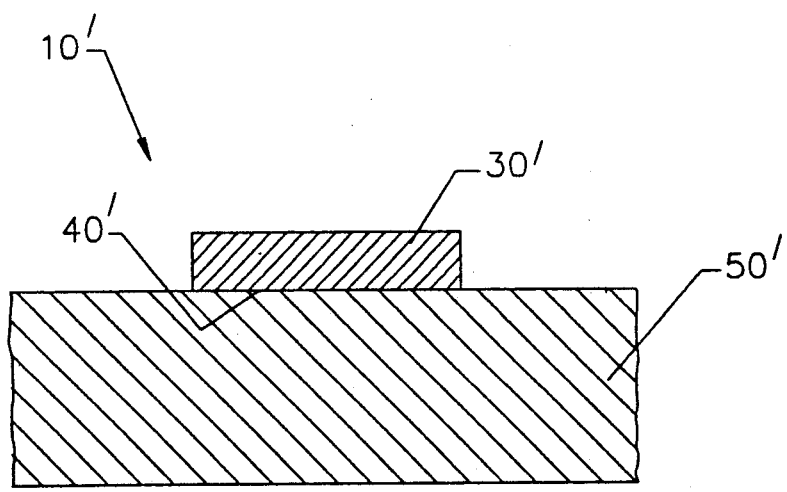
FIG. 2 is a cross-sectional side elevational view of another embodiment of a rectifying contact according to the present invention.

According to another aspect of the present invention as shown in FIG. 2, an alternate embodiment of the contact 10' is provided by forming the heteroepitaxial metal layer 30' directly onto a monocrystalline semiconducting diamond substrate 50'. Thus, the additional process step of forming the monocrystalline diamond layer 20 onto a substrate 50 is avoided. In other embodiments of the invention, the metal layer may be deposited on at least one monocrystalline diamond area of a textured polycrystalline diamond layer or substrate. As would be readily understood by those skilled in the art, a textured polycrystalline layer or substrate may be formed having a plurality of areas of monocrystalline diamond on the surface thereof.

The heteroepitaxial metal layer 30, 30' is deposited substantially in atomic registry with the monocrystalline semiconducting diamond layer 20 or substrate 50' to provide a stable rectifying contact 10, 10' that operates at high temperatures above the operating temperature of traditional Si or GaAs devices. As described in the Example below, the rectifying contact 10, 10' exhibits excellent electrical rectifying properties at test temperatures of 400° C.

The metal of the heteroepitaxial metal layer 30, 30' is selected to have a lattice match with diamond. Preferably, the metal of the heteroepitaxial metal layer has no stable metal carbides so that carbide formation is avoided at higher temperatures. The metal can be nickel, copper, nickel/copper alloy or an alloy of nickel and a metal having no stable metal carbides and capable of forming a homogeneous alloy with nickel (e.g., gold, palladium, platinum, etc.). A homogeneous alloy results when the metal is miscible with the nickel in a solid solution.

The difference between the lattice constant ($a_o$) of the diamond and the lattice constant of the metal (i.e., the lattice mismatch) is preferably less than about 7 percent, preferably less than about 4 percent, and more preferably less than about 2 percent relative to the lattice constant of diamond. For example, the lattice constant of diamond is 3.5668 Å, the lattice constant of nickel is 3.5238 Å, resulting in a lattice mismatch of about 1.2 percent. The lattice constant of copper is 3.6153 Å thereby producing a lattice miss-match with diamond of about 1.4 percent.

The lattice match provides a well-defined boundary or interface between the monocrystalline diamond and the metal layer. Moreover, by lattice matching, the diamond and metal layer may be arranged in atomic registry with each other, namely the dimensions of the crystal structures are substantially in alignment with each other. Such a lattice matching results in the formation of the metal layer in atomic registry with the diamond and in a substantially strain free contact. Accordingly, adverse affects on the electrical and mechanical properties of the contact caused by strain are avoided. If a metal having a lattice match with diamond were to be formed on the diamond without concern for being in atomic registry therewith, mechanical adhesion and thermal stability would be poor at elevated temperatures.

The interface between the diamond layer 20 or substrate 50' and the metal layer 30, 30' is atomically abrupt. There is no intermixing of the diamond and the metal at the interface. Moreover it believed that there is atomic bonding at the interface and thus strong adhesion of the layers together.

The example which follows is provided to further illustrate the present invention and is not to be construed as limiting thereof.

EXAMPLE 1

A D. Drucker & ZN.N.V. monocrystalline low resistivity natural diamond substrate (~$10^4$ Ω-cm, p-type, (001) orientation) available from Dubbeldee Harris Corp. of Mount Arlington, N.J. is chemically cleaned in a 1:1 bath of sulfuric acid and hydrogen peroxide for about 10 minutes. The monocrystalline substrate is then rinsed with deionized water and dried using filtered nitrogen. The substrate is then mounted on a heater.

Figure 3:
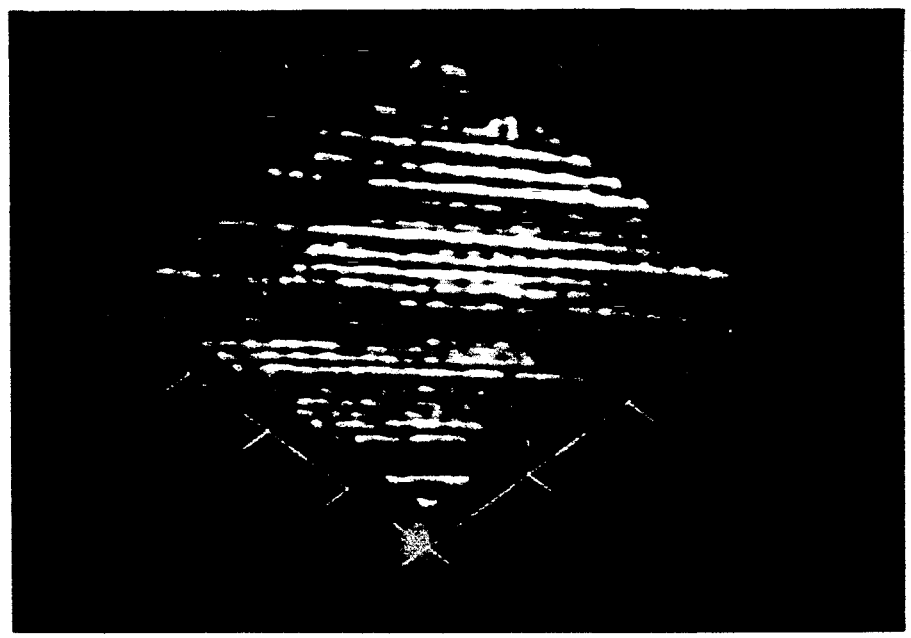
FIG. 3 is a scanning tunneling micrograph (STM) of a rectifying contact provided in accordance with Example 1.

The substrate is heated to about 600° C. for about 10 minutes to thermally desorb water vapor and any other contaminants. Nickel is then deposited using a thermal evaporation technique at 500° C. using a tungsten filament. Heteroepitaxial deposition may be checked using in situ low energy electron diffraction (LEED) studies. The surface morphology using scanning tunneling microscopy (STM) is shown in FIG. 3, and demonstrates that the nickel epitaxial layer replicates the very fine, unidirectional scratches present on the as-polished diamond substrate.

It has been observed that the mechanical adherence of the nickel layers does not degrade following various processing (e.g., ultrasonic cleaning, thermal cycling, electrical probing, etc.) steps. In contrast, metal films deposited at room temperature, for example, gold, have a tendency to peel from the diamond surface during processing.

Figure 4:
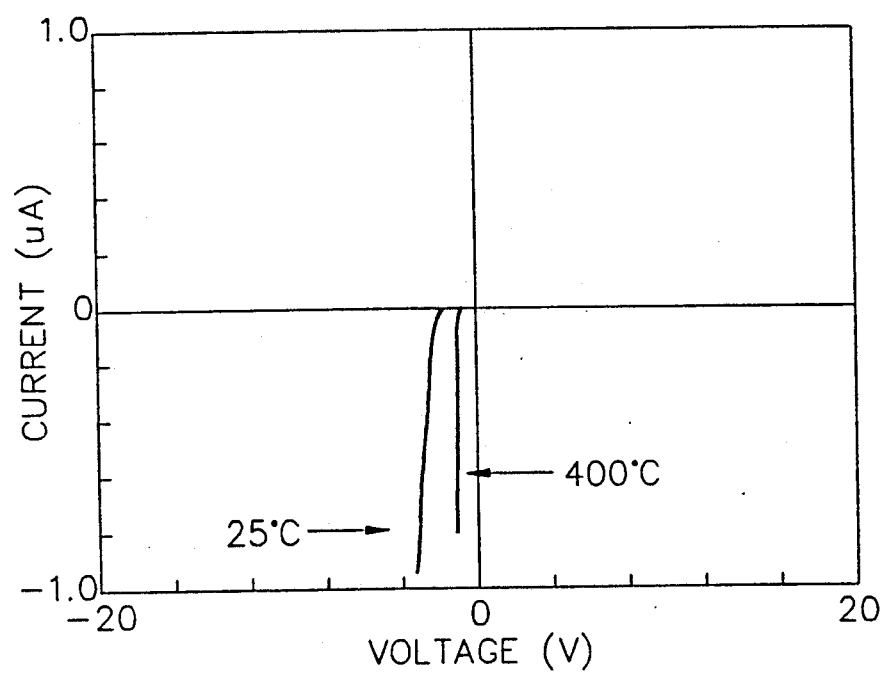
FIG. 4 is a graph indicating the current versus voltage characteristics at 25° C. and 400° C. of a rectifying contact provided in accordance with Example 1 at different operating temperatures.

Current versus voltage (I-V) measurements for the rectifying contact may be obtained using an HP 4135A semiconductor parameter analyzer available from Hewlett-Packard, Palo Alto, California. The diamond substrates may be mounted on a copper plate using silver paint to form a large area back contact. Sample heating in the temperature range between about 25° C. to about 600° C. may be achieved using a ceramic heater assembly. Current versus voltage measurements may be obtained by grounding the copper plate and applying a bias to the nickel layer using a tungsten probe. The corresponding I-V characteristics measured at ambient temperature (i.e., 25° C.) and at 400° C. are shown in FIG. 4.

The rectifying nature of the rectifying contact according to the present invention is clearly evident in this temperature range. In particular, at room temperature, a leakage current of 2 nA is observed at a reverse bias of 20 V. Upon heating to 400° C., the leakage increases to 4 nA which is equivalent to a current density of $1.32 \times 10^{-6}$ A/cm$^2$. Moreover, the contact appears to be very stable at this measurement temperature without any apparent degradation.

At ambient temperature an ideality factor (n) of 2.4 may be calculated from the apparently linear region of the semi-logarithmic plot of the forward characteristics. While not wishing to be bound by the following theory, Applicants theorize that this high n value may be an indication that the current conduction in the nickel and diamond contact is not governed by a thermionic emission mechanism. Therefore, the rise in the forward current cannot be described by a simple exponential function given by $I \alpha \exp(qV/nkT)$. It is believed that the carrier transport is dominated by a space charge limited current (SCLC) conduction mechanism.

As would be readily understood by those skilled in the art, the rectifying contact according to the present invention may be used to fabricate a number of semiconductor devices. Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A semiconductor device comprising:
    a monocrystalline semiconducting diamond layer; and
    a heteroepitaxial crystalline metal layer on said monocrystalline diamond layer for forming a rectifying contact therewith;
    the metal of said heteroepitaxial crystalline metal layer having a lattice match with said monocrystalline diamond layer so that said heteroepitaxial crystalline metal layer is substantially in atomic registry with said monocrystalline diamond layer forming an atomically abrupt interface between said heteroepitaxial crystalline metal layer and said monocrystalline diamond layer with atomic bonding at the interface.

2. The semiconductor device according to claim 1 wherein the diamond of said monocrystalline diamond layer and the metal of said heteroepitaxial metal layer have a lattice mismatch of less than about 7 percent.

3. The semiconductor device according to claim 1 wherein the metal of said heteroepitaxial metal layer is selected from the group consisting of nickel, copper, nickel/copper alloy and an alloy of nickel and a metal having no stable metal carbides and being capable of forming a homogeneous alloy with nickel.

4. The semiconductor device according to claim 3 wherein said metal having no stable metal carbides and being capable of forming a homogeneous alloy with nickel is selected from the group consisting of gold, palladium and platinum.

5. The semiconductor device according to claim 1 wherein said semiconducting diamond layer has a crystalline orientation selected from the group consisting of (001), (011), and (111) orientations.

6. The semiconductor device according to claim 1 further comprising a substrate selected from the group consisting of silicon, diamond, sapphire and boron nitride substrates, and wherein said monocrystalline diamond layer is on said substrate.

7. A semiconductor device comprising:
    a textured polycrystalline diamond layer having a plurality of monocrystalline diamond areas on a surface thereof; and
    a heteroepitaxial crystalline metal layer on at least one of said monocrystalline diamond areas;
    the metal of said heteroepitaxial crystalline metal layer having a lattice match with said monocrystalline diamond area so that said heteroepitaxial metal layer is substantially in atomic registry with said monocrystalline diamond area forming an atomically abrupt interface between said heteroepitaxial crystalline metal layer and said monocrystalline diamond layer with atomic bonding at the interface.

8. The semiconductor device according to claim 7 wherein the diamond of said monocrystalline diamond areas and the metal of said heteroepitaxial metal layer have a lattice mismatch of less than about 7 percent.

9. The semiconductor device according to claim 7 wherein the metal of said heteroepitaxial metal layer is selected from the group consisting of nickel, copper, nickel/copper alloy and an alloy of nickel and a metal having no stable metal carbides and being capable of forming a homogeneous alloy with nickel.

10. The semiconductor device according to claim 9 wherein said metal having no stable metal carbides and capable of forming a homogeneous alloy with nickel is selected from the group consisting of gold, palladium and platinum.

11. The semiconductor device according to claim 7 wherein said monocrystalline diamond area has a crystalline orientation selected from the group consisting of (001), (011), and (111) orientations.

12. The semiconductor device according to claim 7 further comprising a substrate selected from the group consisting of silicon, diamond, sapphire and boron nitride substrates, and wherein said textured polycrystalline diamond layer is on said substrate.

* * * * *